United States Patent
Lee

(10) Patent No.: US 7,486,714 B2
(45) Date of Patent: Feb. 3, 2009

(54) PUMP LASER INTEGRATED VERTICAL EXTERNAL CAVITY SURFACE EMITTING LASER

(75) Inventor: Sang-moon Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/417,193

(22) Filed: May 4, 2006

(65) Prior Publication Data

US 2006/0251136 A1    Nov. 9, 2006

(30) Foreign Application Priority Data

May 4, 2005    (KR)    ............ 10-2005-0037428

(51) Int. Cl.
    *H01S 3/091*    (2006.01)
(52) U.S. Cl. ............ 372/71; 372/50.1; 372/69; 372/70; 372/92
(58) Field of Classification Search ............ 372/69–72, 372/50.1, 92, 93
    See application file for complete search history.

(56) References Cited

U.S. PATENT DOCUMENTS

| | | | | |
|---|---|---|---|---|
| 6,339,607 B1 * | 1/2002 | Jiang et al. | ............ | 372/50.124 |
| 6,556,610 B1 * | 4/2003 | Jiang et al. | ............ | 372/75 |
| 6,580,741 B2 * | 6/2003 | Jiang et al. | ............ | 372/50.11 |
| 6,778,582 B1 * | 8/2004 | Mooradian | ............ | 372/97 |

* cited by examiner

*Primary Examiner*—Minsun Harvey
*Assistant Examiner*—Yuanda Zhang
(74) *Attorney, Agent, or Firm*—Buchanan Ingersoll & Rooney PC

(57) ABSTRACT

Provided is a vertical external cavity surface emitting laser (VECSEL) in which a pump laser is integrated with the rest of the VECSEL as a single body. The VECSEL includes: a first active layer that has a quantum well structure and generates light with a first wavelength; a reflection layer formed on a first surface of the first active layer; an external mirror that is separated by a predetermined distance from a second surface of the first active layer, transmits a portion of light generated by the first active layer to the outside, and reflects the rest of the light generated by the first active layer to be absorbed by the first active layer; and a pump laser disposed on the reflection layer as a single body to provide light with a second wavelength which is shorter than the first wavelength to the first active layer for optical pumping.

15 Claims, 2 Drawing Sheets

PUMP LASER INTEGRATED VERTICAL EXTERNAL CAVITY SURFACE EMITTING LASER

CROSS-REFERENCE TO RELATED PATENT APPLICATION

This application claims the benefit of Korean Patent Application No. 10-2005-0037428, filed on May 4, 2005 in the Korean Intellectual Property Office, the disclosure of which is incorporated herein in its entirety by reference.

BACKGROUND OF THE INVENTION

1. Field of the Invention

The present invention relates to a vertical external cavity surface emitting laser (VECSEL), and more particularly, to a VECSEL in which a pump laser is integrated with the rest of the VECSEL.

2. Description of the Related Art

Generally, semiconductor lasers are classified into edge emitting lasers in which a light beam is emitted parallel to a substrate and vertical cavity surface emitting lasers (VCSELs) in which a light beam is emitted in a direction perpendicular to a substrate. A VCSEL oscillates in a single longitudinal mode of a very narrow spectrum and emits a beam having a small radiation angle. Also, as integration with other appliances is easy due to the characteristics of surface light emission, the VCSEL can be used as a pumping light source. However, a conventional VCSEL makes single transverse mode oscillation difficult in comparison with the edge emitting lasers. Also, transverse mode operation of the conventional VCSEL requires a small oscillation region. Thus, the output power of the VCSEL is low.

A vertical external cavity surface emitting laser (VECSEL) provides the advantages of a VCSEL described above while realizing high power output at the same time. The VECSEL has an external mirror in place of an upper DBR included in a VCSEL, and thus has a larger gain area and can obtain an output power of several to several tens of watts or more.

FIG. 1 is a schematic cross-sectional view of a VECSEL 10 using conventional optical pumping. Referring to FIG. 1, the conventional VECSEL 10 includes a heat sink 11, a Distributed Bragg Reflector (DBR) layer 12 formed on the heat sink 11, an active layer 13, an external mirror 14 separated from the active layer 13 by a predetermined distance, and a pump laser 16 exciting the active layer 13. A second harmonic generation (SHG) crystal 15 doubles the frequency of light between the active layer 13 and the external mirror 14. The active layer 13 may have a multiple quantum well structure having a resonant periodic gain (RPG) structure, and emits light with a predetermined wavelength. The heat sink 11 exhausts heat generated in the active layer 13 to cool the active layer 13. A resonant cavity is formed between the DBR layer 12 and the concave external mirror 14. The pump laser 16 emits light at a shorter wavelength than the wavelength of the light generated by the active layer 13. The light from the pump laser 16 passes through a lens array 17 onto the active layer 13 to excite the active layer 13.

In the above described structure, when the light at a relatively short wavelength generated by the pump laser 16 is incident on the active layer 13 through the lens array 17, the active layer 13 is excited and emits light with a predetermined wavelength. The light is repeatedly reflected between the DBR layer 12 in the lower portion of the active layer 13 and the external mirror 14 to reciprocate through the active layer 13. Thus a portion of the light amplified in the active layer 13 is output to the outside as a laser beam through the external mirror 14 and the rest of the light is reflected again to be used for optical pumping in the active layer 13.

However, the active layer 13 and the pump laser 16 are manufactured separately and then integrated in the VECSEL 10. Additionally, the pump laser 16 should be oriented at a proper angle such that the light emitted from the pump laser 16 can be incident on the active layer 13, and a lens array 17 should be disposed between the pump laser 16 and the active layer 13. Accordingly, mass production of the laser device is difficult and the size of the laser increases. Thus the manufacturing time and costs are increased.

SUMMARY OF THE INVENTION

The present invention provides a vertical external cavity surface emitting laser (VECSEL) which can be manufactured in large quantities at low costs by manufacturing a pump laser and an active layer at one time in a simple process, thus not requiring additional manufacturing processes.

According to an aspect of the present invention, there is provided a VECSEL comprising: a first active layer that has a quantum well structure and generates light with a first wavelength; a reflection layer formed on a first surface of the first active layer; an external mirror that is separated by a predetermined distance from a second surface of the first active layer, transmits a portion of light generated by the first active layer to the outside, and reflects the rest of the light generated by the first active layer to be absorbed by the first active layer; and a pump laser disposed on the reflection layer as a single body to provide light with a second wavelength which is shorter than the first wavelength to the first active layer for optical pumping.

The pump laser may be an edge emitting laser and comprises an inclined mirror that is disposed at an end of the pump laser and reflects the light generated by the pump laser to the first active layer.

The pump laser may comprise: an n-contact layer, an n-clad layer, a second active layer generating light with the second wavelength, a p-clad layer, and a p-contact layer sequentially formed on the reflection layer; and a reflection mirror for reflecting the light at the second wavelength to the inclined mirror and formed perpendicularly at a first side of the n-clad layer, the second active layer and the p-clad layer, wherein at least a second side formed by the n-clad layer, the second active layer, and the p-clad layer is inclined, and the inclined mirror is disposed on the second side formed by the n-clad layer, the second active layer, and the p-clad layer.

The reflection layer may transmit to the first active layer a portion of the light with the second wavelength generated by the second active layer and reflects to the reflection mirror via the inclined mirror the rest of the light with the second wavelength generated by the second active layer. The reflection layer may be a Distributed Bragg Reflector (DBR) having maximum reflectivity with respect to the light with the first and second wavelengths.

Accordingly, a cavity for the light with the first wavelength may be formed between the reflection layer and the external mirror and a cavity for the light with the second wavelength may be formed between the reflection mirror and the reflection layer and folded by the inclined mirror at a substantially right angle.

A substrate supporting the first active layer may be disposed on the second surface of the first active layer. A portion of the substrate corresponding to the light path of the light with the first wavelength generated by the first active layer is cut.

Also, the VECSEL may further comprise a second harmonic generation (SHG) crystal interposed between the first active layer and the external mirror to double the frequency of the light having the first wavelength.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
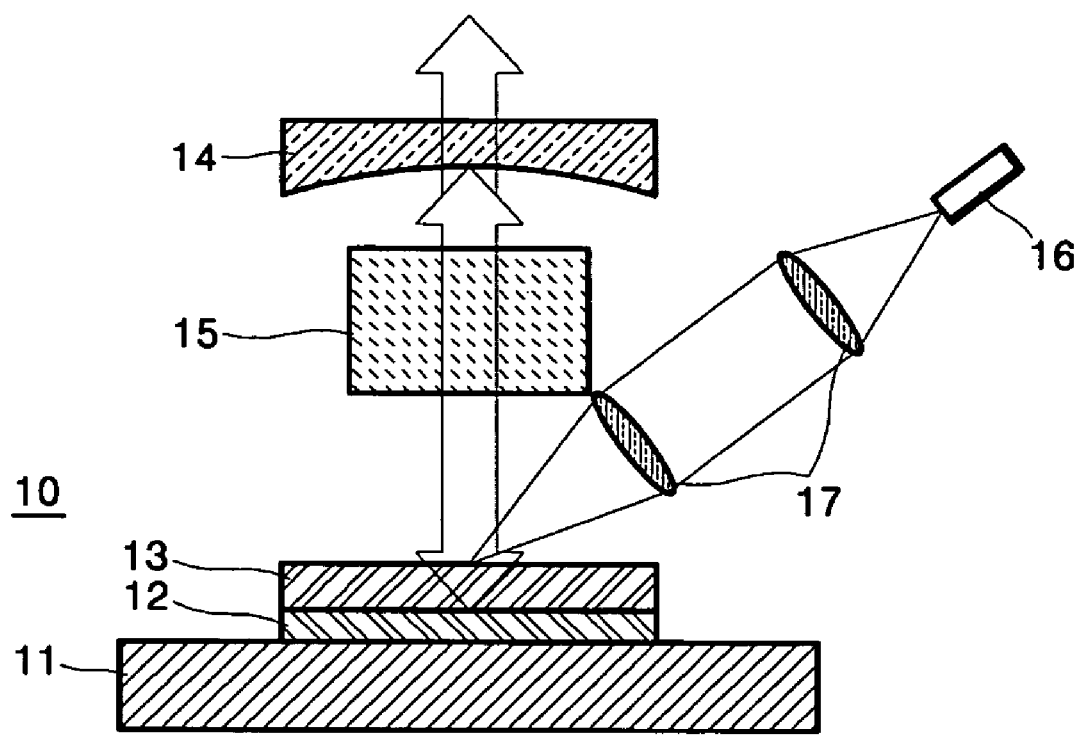
FIG. 1 is a cross-sectional view of a conventional vertical external cavity surface emitting laser (VECSEL) using optical pumping.
Figure 2:
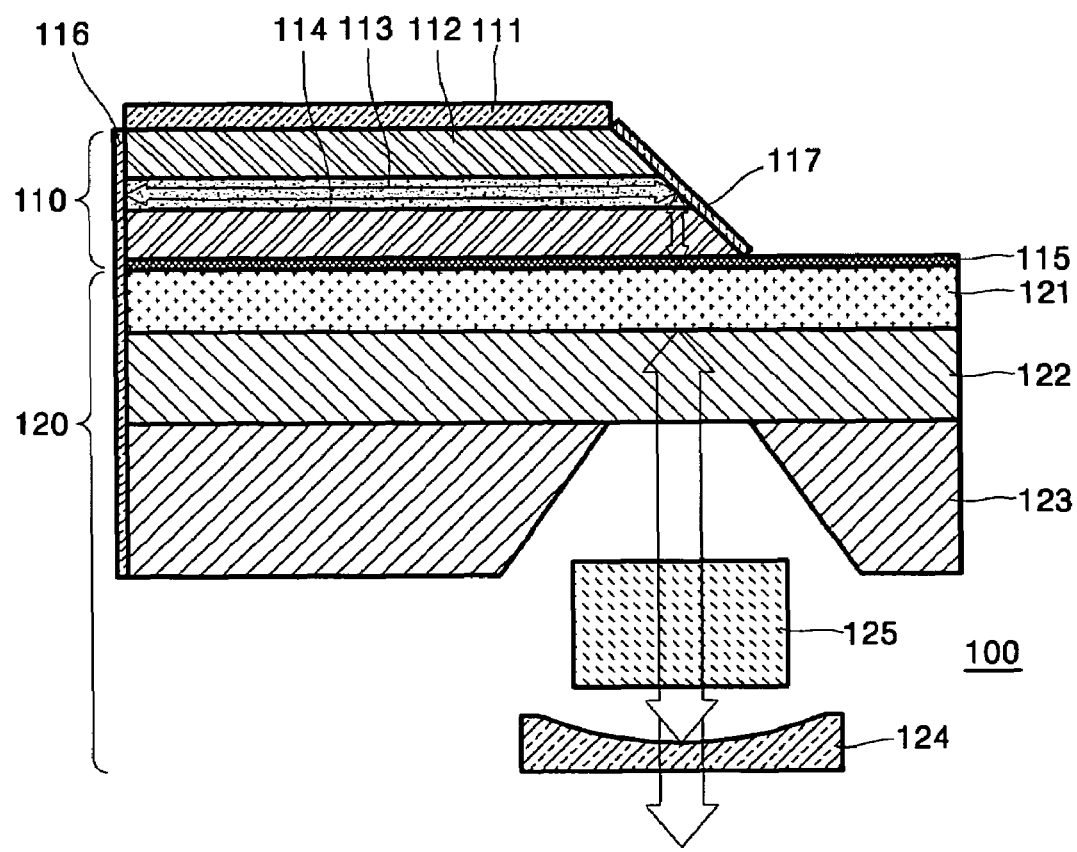
FIG. 2 is a cross-sectional view of a VECSEL in which a pump laser is integrated with the rest of the VECSEL as a single body according to an embodiment of the present invention.

FIG. 2 is a cross sectional view of a vertical external cavity surface emitting laser (VECSEL) 100 in which a pump laser is integrated with the rest of the VECSEL as a single body according to an embodiment of the present invention Referring to FIG. 2, the VECSEL 100 includes a pump laser unit 110 and a surface emitting laser unit 120. In the conventional VECSEL, an additional pump laser is disposed outside the VECSEL to provide a laser beam for optical pumping at an angle of 45° on an active layer of the VECSEL. However, in the present embodiment, the pump laser unit 110 is disposed as a single body on the surface emitting laser unit 120 including an external mirror 124. Accordingly, the VECSEL 100 according to the present embodiment can be manufactured with the pump laser through a simple process.

Specifically, the surface emitting laser unit 120 includes a first active layer 122 and a reflection layer 121 sequentially formed on a substrate 123. The external mirror 124 is disposed below the substrate 123, separated from the active layer 122. The substrate 123 may be an n-doped semiconductor substrate, for example, an n-GaAs layer. The first active layer 122 is excited by a laser beam from the pump laser unit 110 and emits light at a predetermined wavelength. For example, the first active layer 122 may have a multi quantum well structure formed of alternating quantum wells and barriers.

The reflection layer 121 reflects the light emitted from the active layer 122 to the external mirror 124. Accordingly, a cavity for the light emitted from the active layer 122 is disposed between the reflection layer 121 and the external mirror 124. The reflection layer 121 may be a Distributed Bragg Reflector (DBR) layer having a multi-layer structure including high-refractive-index layers and low-refractive-index layers disposed alternately. The high-refractive-index layers may be composed of a compound semiconductor such as GaAs and the low-refractive-index layers may be composed of a compound semiconductor such as AlAs. The reflection layer 121 may be a dielectric such as $SiO_2$ instead of a DBR.

The surface emitting laser unit 120 may further include a second harmonic generation (SHG) crystal 125 interposed between the active layer 122 and the external mirror 124 to double the frequency of the light generated by the first active layer 122.

The pump laser unit 110 includes an n-contact layer 115 formed on the reflection layer 121, an n-clad layer 114 formed on the n-contact layer 115, a second active layer 113 formed on the n-clad layer 114, a p-clad layer 112 formed on the second active layer 113, and a p-contact layer 111 formed on the p-clad layer 112. The n-contact layer 115 and the p-contact layer 111 produce current to excite the second active layer 113. The second active layer 113 emits light for optical pumping to excite the first active layer 122. Accordingly, the wavelength of the light emitted from the second active layer 113 may be shorter than the wavelength of the light emitted from the first active layer 122. The n-clad layer 114 and the p-clad layer 112 respectively supply electrons and holes to the second active layer 113.

In the present embodiment, a high reflectivity mirror 116 is disposed vertically along at least an edge on one side of the n-clad layer 114, the second active layer 113, and the p-clad layer 112 to reflect the light generated in the second active layer 113. The high reflectivity mirror 116 may have maximum reflectivity with respect to the light generated by the second active layer 113, and may be composed of a dielectric such as $SiO_2$. In addition, an inclined mirror 117 is formed along an edge on the other side of the n-clad layer 114, the second active layer 113, and the p-clad layer 112, and is inclined. The inclined mirror 117 reflects the light generated by the second active layer 113 to the reflection mirror 121. When the inclined mirror 117 is inclined at an angle of greater than 20°, the light incident on the inclined mirror 117 is totally internal reflected by the inclined mirror 117. Therefore, the inclination angle of the inclined mirror 117 may be greater than 20°, and it is most preferable that the inclination angle of the inclined mirror 117 is 45°. The inclined mirror 117 may be composed of the same material as the high reflectivity mirror 116.

The light generated by the second active layer 113 travels parallel to the second active layer 113 between the high reflectivity mirror 116 and the inclined mirror 117. Accordingly, the pump laser unit 110 may have the same structure as an edge emitting layer. However, since light is emitted vertically to the second active layer 113 by the inclined mirror 117, the pump laser unit 110 may also be regarded as a surface emitting laser.

The operation of the VECSEL 100 according to the present embodiment will now be described.

First, when a voltage is supplied through the n-contact layer 115 and the p-contact layer 111 of the pump laser unit 110, electrons and holes are supplied from the n-clad layer 114 and the p-clad layer 112 to the second active layer 113. The electrons and the holes recombine in the second active layer 113 and light is generated. The light generated in the second active layer resonates between the high reflectivity mirror 116 and the reflection layer 121 via the inclined mirror 117. As a result, a portion of the light amplified in the second active layer 113 passes through the reflection layer 121 to the first active layer 122. The rest of the light is reflected by the reflection layer 121 to the high reflectivity mirror 116 through the inclined mirror 117. Accordingly, a cavity for light generated in the second active layer 113 is formed between the high reflectivity mirror 116 and the reflection layer 121 and folded by the inclined mirror 117 substantially at a right angle. Thus the reflection layer 121 may be a multiple band reflector having a maximum reflectivity with respect to not only the light generated by the first active layer 122, but also the light generated by the second active layer 113. The multiple band reflector can be manufactured using a DBR or a dielectric such as $SiO_2$, as is well known in the art.

The light passing through the reflection layer 121 is incident on the first active layer 122 for optical pumping. The first active layer 122 is excited and emits light having a predetermined wavelength. The light generated by the first active layer 122 reciprocates between the reflection layer 121 and the external mirror 124 and is amplified by the first active layer 122. As a result, a portion of the amplified light is output as a laser beam through the external mirror 124. When the SHG crystal 125 is placed between the first active layer 122 and the external mirror 124, light with a shorter wavelength can be emitted as a laser beam. For example, in a VECSEL using a nitride semiconductor device as an active layer, infrared light in the range of 900 nm to 1300 nm is generated. When the SHG crystal 125 is used, visible light in the range of 450 nm to 650 nm, that is, ranging from blue light to red light, can be emitted.

A substrate 123 is disposed between the active layer 122 and the external mirror 124. To reduce the amount of light having to pass through the substrate 123, a portion of the substrate 123 corresponding to the path of light from the active layer 122 may be cut.

The present invention is not limited thereto. For example, in the present embodiment, the first active layer 122, the reflection layer 121, the n-contact layer 115, the n-clad layer 114, the second active layer 113, the p-clad layer 112, and the p-contact layer 111 are sequentially formed on the substrate 123. However, the opposite order may be possible, that is, the p-contact layer 111, the p-clad layer 112, the second active layer 113, the n-clad layer 114, the n-contact layer 115, the reflection layer 121, and the first active layer 122 may be sequentially formed on the substrate 123.

According to the present invention, the pump laser unit and the surface emitting laser unit in the VECSEL can be manufactured at one time through a simple process. Accordingly, additional complicated processes for arranging a pump laser and a lens array focusing light generated by the pump laser are not required. Therefore, the manufacturing time of the laser can be reduced by a large amount and the laser can be manufactured at low costs. Moreover, the size of the laser can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface emitting laser (VECSEL) comprising:
    a first active layer that has a quantum well structure and generates light with a first wavelength;
    a reflection layer located adjacent to a first surface of the first active layer, wherein the reflection layer reflects light of the first wavelength generated by the first active layer and reflects light of the first wavelength generated by the first active layer;
    an external mirror that is separated by a predetermined distance from a second surface of the first active layer, transmits a portion of light generated by the first active layer to the outside, and reflects the rest of the light generated by the first active layer to be absorbed by the first active layer, wherein the first active layer, the reflection layer and external mirror comprise a surface emitting laser unit; and
    a pump laser disposed on the reflection layer as a single body with the reflection layer and first active layer to provide light with a second wavelength that is shorter than the first wavelength to the first active layer for optical pumping, wherein the reflection layer transmits to the first active layer a portion of the light with the second wavelength generated by the pump laser and reflects to the pump laser the rest of the light with the second wavelength generated by the pump laser, wherein the reflection layer is a shared cavity mirror with the pump laser unit and the surface emitting laser unit.

2. The VECSEL of claim 1, wherein the pump laser is an edge emitting laser and comprises an inclined mirror that is disposed at an end of the pump laser and reflects the light generated by the pump laser to the first active layer.

3. The VECSEL of claim 2, wherein the pump laser comprises:
    an n-contact layer, an n-clad layer, a second active layer generating light with the second wavelength, a p-clad layer, and a p-contact layer sequentially formed on the reflection layer; and
    a reflection mirror for reflecting the light at the second wavelength to the inclined mirror and formed perpendicularly at a first side of the n-clad layer, the second active layer and the p-clad layer,
    wherein at least a second side formed by the n-clad layer, the second active layer, and the p-clad layer is inclined, and the inclined mirror is disposed on the second side formed by the n-clad layer, the second active layer, and the p-clad layer.

4. The VECSEL of claim 3, wherein the reflection layer transmits to the first active layer a portion of the light with the second wavelength generated by the second active layer and reflects to the reflection mirror via the inclined mirror the rest of the light with the second wavelength generated by the second active layer.

5. The VECSEL of claim 4, wherein the reflection layer is a Distributed Bragg Reflector (DBR) having maximum reflectivity with respect to the light with both the first and second wavelengths.

6. The VECSEL of claim 4, wherein a cavity for the light with the first wavelength is formed between the reflection layer and the external mirror and a cavity for the light with the second wavelength is formed between the reflection mirror and the reflection layer and folded by the inclined mirror at a substantially right angle.

7. The VECSEL of claim 1, wherein a substrate supporting the first active layer is disposed adjacent the second surface of the first active layer.

8. The VECSEL of claim 7, wherein a portion of the substrate corresponding to the light path of the light with the first wavelength generated by the first active layer is absent.

9. The VECSEL of claim 1, further comprising a second harmonic generation (SHG) crystal interposed between the first active layer and the external mirror to double the frequency of the light having the first wavelength.

10. A VECSEL comprising:
    a first active layer that has a quantum well structure and generates light with a first wavelength;
    a reflection layer located adjacent to the first active layer and reflects light of the first wavelength generated by the first active layer;
    a pump laser unit comprising an n-contact layer, an n-clad layer, a second active layer generating light with a second wavelength which is shorter than the first wavelength, a p-clad layer, and a p-contact layer;
    an external mirror that is separated from a bottom surface of the first active layer, transmits a portion of the light generated by the first active layer, and reflects the rest of the light generated by the first active layer to be absorbed by the first active layer;

a reflection mirror that is disposed at a first side of the n-clad layer, the second active layer, and the p-clad layer and reflects the light with the second wavelength traveling parallel to the second active layer, wherein the first active layer, the reflection layer and external mirror comprise a surface emitting laser unit; and an inclined mirror that reflects the light with the second wavelength substantially perpendicularly to the reflection layer and is disposed at a second side of the n-clad layer, the second active layer, and the p-clad layer, wherein the reflection layer transmits to the first active layer a portion of the light with the second wavelength generated by the second active layer and reflects to the reflection mirror via the inclined mirror the rest of the light with the second wavelength generated by the second active layer, wherein the reflection layer is a shared cavity mirror with the pump laser unit and the surface emitting laser unit.

11. The VECSEL of claim 10, wherein the reflection layer is a DBR having maximum reflectivity with respect to the light with the first and second wavelengths.

12. The VECSEL of claim 10, wherein a cavity for the light with the first wavelength is formed between the reflection layer and the external mirror and a cavity for the light with the second wavelength is formed between the reflection mirror and the reflection layer and folded by the inclined mirror at a substantially right angle.

13. The VECSEL of claim 10, wherein a substrate supporting the first active layer is disposed on a bottom surface of the first active layer.

14. The VECSEL of claim 13, wherein a portion of the substrate corresponding to the light path of the light with the first wavelength generated by the first active layer is absent.

15. The VECSEL of claim 10, further comprising an SHG crystal interposed between the first active layer and the external mirror to double the frequency of the light having the first wavelength.

* * * * *